(12) United States Patent
Nakagawa (10) Patent No.: US 7,614,787 B2
(45) Date of Patent: Nov. 10, 2009

(54) MARKING APPARATUS USED IN A PROCESS FOR PRODUCING MULTI-LAYERED PRINTED CIRCUIT BOARD

(75) Inventor: Wataru Nakagawa, Tokyo (JP)

(73) Assignee: Adtec Engineering Co., Ltd., Tokyo (JP)

(*) Notice: Subject to any disclaimer, the term of this patent is extended or adjusted under 35 U.S.C. 154(b) by 38 days.

(21) Appl. No.: 11/821,829

(22) Filed: Jun. 26, 2007

(65) Prior Publication Data
US 2008/0013679 A1   Jan. 17, 2008

(30) Foreign Application Priority Data
Jul. 10, 2006   (JP)   ............... 2006-188972

(51) Int. Cl.
*G21K 5/00* (2006.01)
*A61B 6/08* (2006.01)
*G01N 23/083* (2006.01)

(52) U.S. Cl. .................. 378/205; 378/34; 378/163
(58) Field of Classification Search ............ 378/34, 378/163, 205
See application file for complete search history.

(56) References Cited

U.S. PATENT DOCUMENTS

| | | | |
|---|---|---|---|
| 4,642,160 A * | 2/1987 | Burgess | 216/18 |
| 6,381,005 B1 * | 4/2002 | Kasumi et al. | 355/75 |
| 6,597,757 B2 * | 7/2003 | Ida et al. | 378/34 |
| 6,609,297 B1 * | 8/2003 | Hiramatsu et al. | 29/852 |
| 7,178,229 B2 * | 2/2007 | Borland et al. | 29/831 |
| 2003/0081719 A1 | 5/2003 | Ida et al. | |

FOREIGN PATENT DOCUMENTS

JP   2003-131401   5/2003

* cited by examiner

*Primary Examiner*—Irakli Kiknadze
*Assistant Examiner*—Thomas R Artman
(74) *Attorney, Agent, or Firm*—Weingarten, Schurgin, Gagnebin & Lebovici LLP (57) ABSTRACT

X-rays are irradiated at the board 5 from the X-ray generator 11, the image of the standard marks 50, 51 are projected on the fluorescence screen 12, the resulted image is photographed simultaneously by one shot of the visible light CCD camera 13 and finally processed by the control device 9 to simultaneously determine the position of the standard marks 50 and 51. the alignment marks depicted on the photo masks 24 and 25 are imprinted on the dry film resist layers 55 respectively based on the positions of the standard marks 50 and 51 by irradiating X-rays through the sets of mirrors 22, 23 on the dry film resist layers 55.

17 Claims, 6 Drawing Sheets

MARKING APPARATUS USED IN A PROCESS FOR PRODUCING MULTI-LAYERED PRINTED CIRCUIT BOARD

This application claims priority to Japanese application No. 2006-188972 filed Jul. 10, 2006.

BACKGROUND OF THE INVENTION

This invention relates to a marking apparatus used in a process for producing multi-layered printed circuit board.

As electric products are becoming lighter, thinner, shorter, smaller and more functional, which is typically shown in cellular phones, a printed circuit board used in such electric products is also becoming more precise. The multi layered printed circuit board has been developed in this trend, the board is manufactured by a so-called build-up method. The multi layered printed circuit board has a core board, on both back and front faces of which resin isolation layers and conductive patterns made of copper or the like are alternately formed and laminated. The layers are conductive through a hole called a via hole that is plated by copper. The conductive patterns are formed by a lithography method using an aligner having a photo mask that is depicted with an original pattern.

When building up the layers, it is very important to adjust the positions of the layers. The new pattern on a new build up layer must be precisely formed at a certain position relevant to the old pattern on the old layer formed already. To accomplish the alignment between the new and old patterns, an alignment mark depicted on the film mask and a board mark (referred to as a standard mark hereinafter) formed on the board are utilized.

Furthermore, the position of the via-hole must be precisely determined in relation to the unseen pattern formed on a lower layer.

However, the alignment mark on the core board is invisible because the layer is covered by copper foil before the pattern is formed.

Thus the applicant proposed by the Japan Patent laid-open No. 2003-131401 (corresponding to EP1307079A1, U.S. Pat. No. 6,597,757B2 (US2003081719A1), CN1414431A, KR20030035872A, TW545090B) an inventive marking apparatus used in a process for producing multi-layered printed circuit boards with a plurality of insulation layers and patterned conductive layers, having a standard mark that can be detected by X-rays formed on at least one of said layers of said multi-layered printed circuit board, means for irradiating X-rays on an area containing said mark and detecting the position of the mark, and means for making another new mark on an outer layer of said multi-layered printed circuit board based on the position of the standard mark.

In said apparatus, since another alignment mark can be formed on the subsequent outer layers based on the detected mark, it becomes possible to align the news marks to the standard mark. The new alignment mark(s) is typically formed at the position on each layer, corresponding precisely to the detected position of the mark.

However when making the new marks on both side of the board, the front side mark and rear side mark can be made on only the same position in the plane direction (X-Y direction) because the marks are made based on the one same standard mark.

Positioning gaps in a plane direction between the multiple layers can be caused by various reasons in process of making the layers. The conventional marking device uses one standard mark when forming a new mark of the front side and a new mark of the rear side. Thus the positioning gaps of the new marks against the lower layers can arise when the layers have the gaps therebetween in a plane direction.

The object of the invention is to resolve the problem of the conventional marking apparatus.

SUMMARY OF THE INVENTION

A marking apparatus of the invention is used in a process for producing multi-layered printed circuit board having a core board, plurality of isolation layers and conductive layers at both front and rear sides of the core board. The apparatus has at least two standard marks, a position detecting device, a marking device, and another marking device.

Said at least two standard marks are formed on different layers of said plurality of layers and disposed in a certain area in a plane direction.

Said position detecting device simultaneously detects the positions in a plane direction of the standard marks by simultaneously photographing the standard marks in the certain area using X-rays irradiating toward thickness direction of the multi-layered printed circuit board.

Said marking device makes a new mark on a surface of the multi-layered printed circuit board based on the detected position of the one of said standard marks.

Said another marking device makes another new mark on a surface of the multi-layered printed circuit board based on the detected position of the other one of said standard marks.

The apparatus of the invention can simultaneously photograph the two standard marks and detect the positions of the two marks in short time. The standard marks are preferably different in at least one of size and shape so as to be easily distinguished.

When the standard marks are disposed respectively on the front side and on the rear side, marking processes on the front and rear sides can be conducted easily in short time.

In the preferred embodiment, said at least two standard marks are arranged with a gap therebetween in a plane direction in a certain area so that the marks can be further easily distinguished. The plane direction means X-Y direction of a face on which the standard marks are projected by X-rays radiation. The certain area typically corresponds to a visual field of photographic means of the position detecting device and it is the narrowest area.

One of the standard marks may have a hole and the other may be placed in the hole with the gap therebetween.

The gap is preferably more than tolerance of the position in plane direction of the layers on which the standard marks are formed so as to avoid the overlapping of the image of the marks when there is difference of the positions in plane direction between the layers that was produced in the process of making the layers.

It is also possible to detect the positions of the overlapped standard marks depending on conditions by distinguishing the marks by light and shade of the images of the marks.

In the preferred embodiment said position detecting device comprises a X-ray generator disposed at the one side of the multi-layered printed circuit board for irradiating X-rays in the thickness direction of the circuit board, a fluorescence screen disposed at another side of the multi-layered printed circuit board for detecting said X-rays penetrating said circuit board, converting the X-rays into visible rays and projecting the visible images of the standard marks on the surface thereof, a photographing device for photographing said images of the standard marks projected on the fluorescence screen.

DETAILED DESCRIPTION OF THE PREFERRED EMBODIMENTS

The invention will now be described in reference to the attached drawings.

Figure 1:
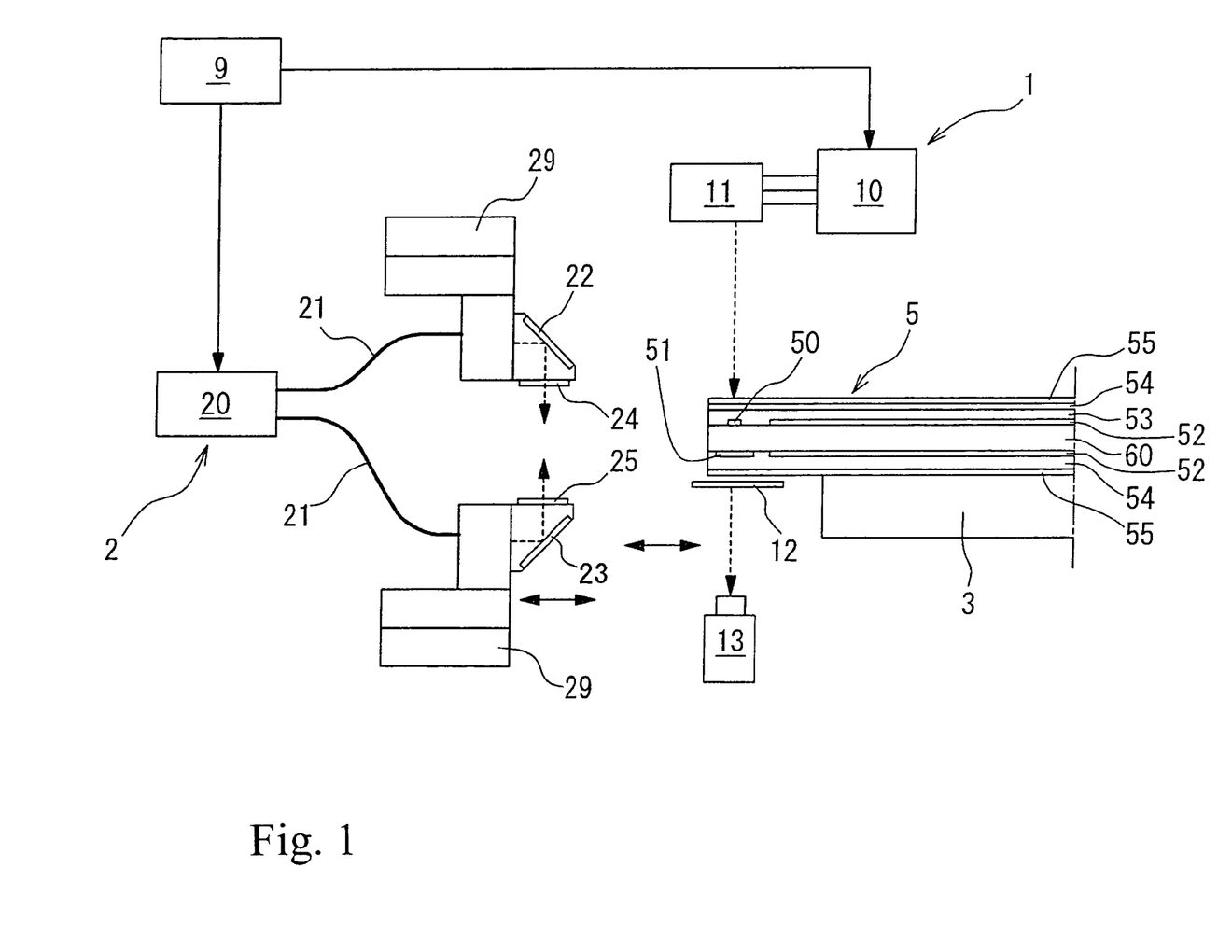
FIG. 1 is a schematic view of an embodiment of the invention.

Referring to FIG. 1, in this embodiment, new alignment mark will be exposed and imprinted by ultra-violet rays on a dry film used for patterning a next layer to be built up.

Figure 2:
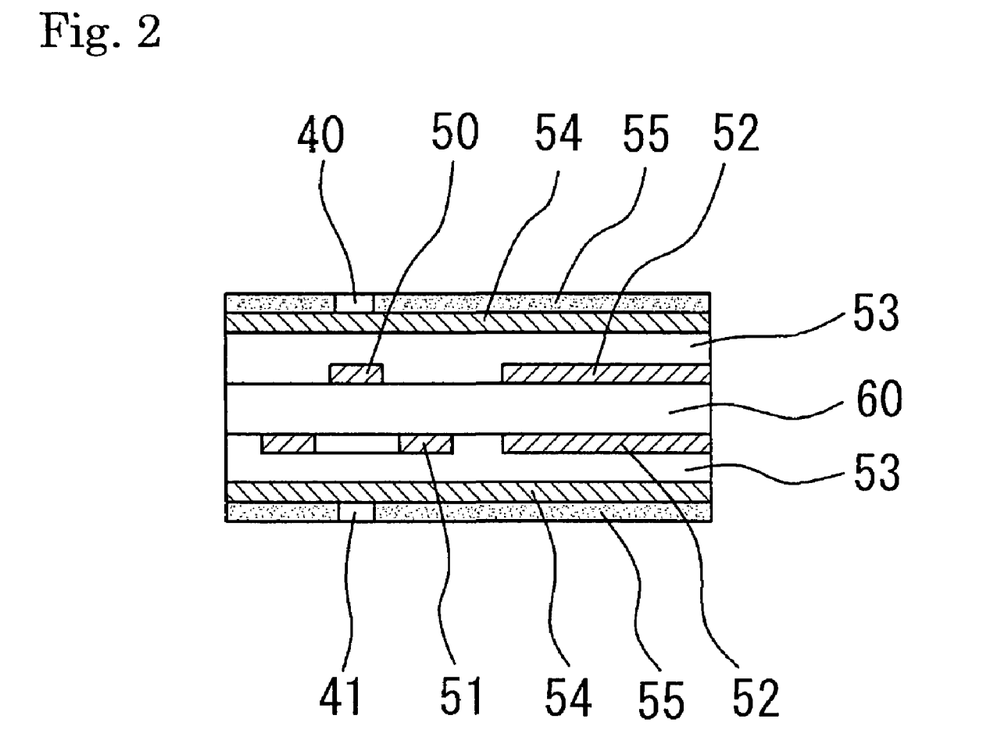
FIG. 2 is a enlarged fragmentary sectional view of the board 5.

A board 5, which is transferred from the preceding process, comprises a circuit pattern 52 formed on a core board 60, an insulation layer 53 formed thereon, a conductive layer 54 formed further for forming a next circuit pattern, and finally a dry film resist layer 55 on top. These multi-layer structures are formed on both front and rear sides of the board 5, respectively.

At boarders in both front and rear sides of the core board 60, are disposed copper foil standard marks 50, 51 formed simultaneously when the circuit patterns 52, 52 were formed.

The board 5 is transferred from the preceding process in this state, and will be placed on a board stage 3. The board stage 3 is movable in the XYZ directions and rotatable in θ degree angle, that allows the board 5 to move in arbitrary directions.

The marking apparatus of the invention comprises a standard mark detection device 1, a marking device 2, the board stage 3 described above, and a control device 9.

The standard mark detection device 1 is equipped with an X-ray power source 10, an X-ray generator 11, a fluorescence screen 12, and a visible light CCD camera 13.

The X-ray generator 11 is disposed so as to irradiate X-rays in the direction toward the board 5. The fluorescence screen 12 is placed behind the board 5, thereby receiving the X-rays transmitted through the board 5.

The fluorescence screen 12 converts the X-rays to visible light, and projects an image created by the X-rays on its rear side. The visible light CCD camera 13 is placed further below the fluorescence screen 12, thereby photographing the image emerged on the rear side of the fluorescence screen 12 and transmitting it to the control device 9 where appropriate image processing takes place.

The size of the fluorescence screen 12 is bigger than the visual sight of the CCD camera 13 as usual, and the area of the visual sight of the column of the optics (the visual sight of the standard mark detection device 1) is defined by the area of the visual sight of the CCD camera 13.

The details of the standard mark 50 and the standard mark 51 are explained in reference to FIGS. 2-5.

Figure 3:
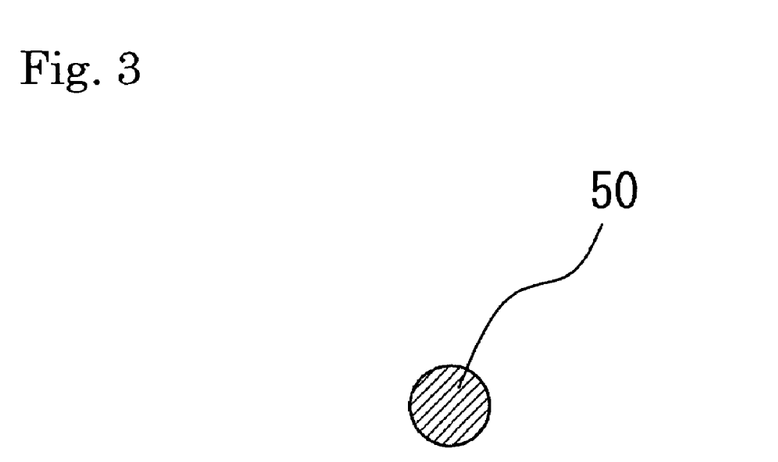
FIG. 3 is a plane view of the standard mark 50.
Figure 4:
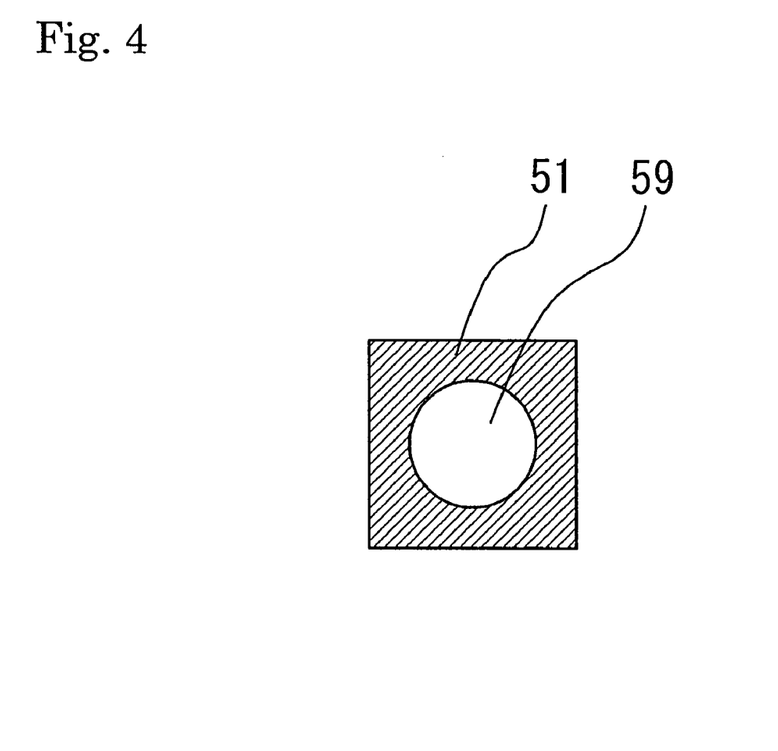
FIG. 4 is a plane view of the standard mark 51.

The standard mark 50 is disposed on the front side of the core board 60 as part of the circuit pattern 52 on the front side and the standard mark 51 is disposed on the rear side of the core board 60 as part of the circuit pattern 52 on the rear side. As shown in FIG. 3, the standard mark 50 has a round shape in plane view. The standard mark 51 has a square shape in plane view as shown in FIG. 4 and the standard mark 51 has a round hole 59 at center part.

Figure 5:
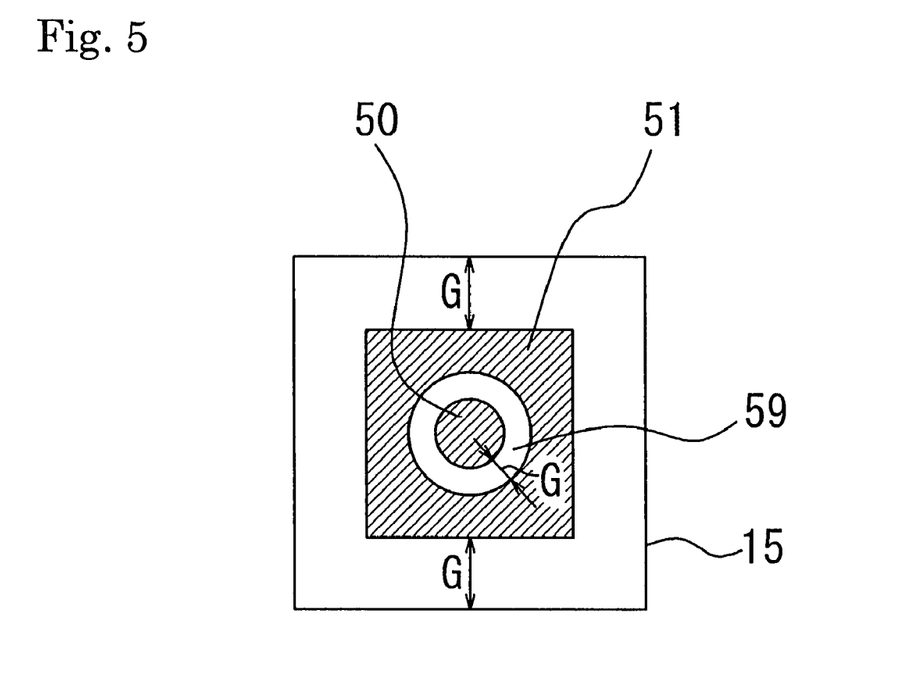
FIG. 5 is a plane view of the projected shapes of the standard mark 50 and the standard mark 51.

The round hole 59 is lager in the diameter than the standard mark 50 and the standard mark 50 is positioned in the round hole 59 in plane view as shown in FIG. 5 so that both the standard marks 50 and 51 can be photographed at one shot by the visible light CCD camera 13.

A new mark 40 is formed based on the standard mark 50 at the counter par of dry film resist layer 55 of the front side and another new mark 41 is formed based on the standard mark 51 at the counter par of dry film resist layer 55 of the rear side.

As shown in FIG. 5, there is a gap G between the standard mark 50 and the standard mark 51 in plane view and both have a size which can be disposed inside of a visual area 15.

The gap G is corresponding to tolerance when making the standard mark 50 and the standard mark 51. The gap G must be at least tolerance and preferably more than tolerance.

Figure 6:
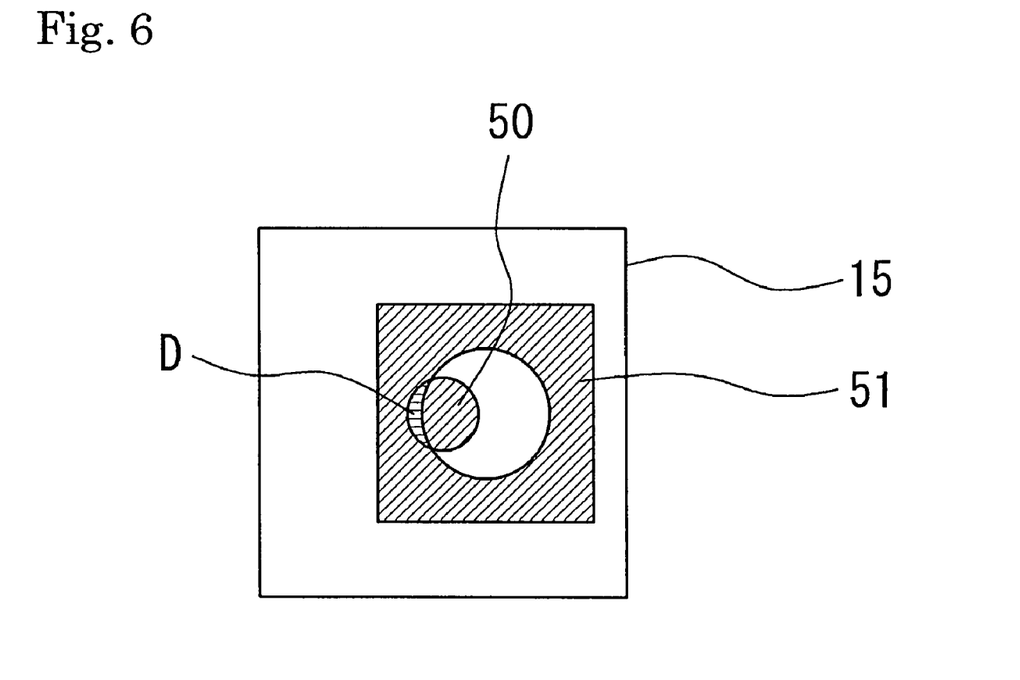
FIG. 6 is a plane view of the projected overlapped shapes of the standard mark 50 and the standard mark 51.

FIG. 6 shows the case where the gap G is small, less than tolerance and insufficient and a overlapping part D appears. The gap G must correspond at least to tolerance in order to avoid such overlapping.

For the same reason, the standard mark 51 can be positioned out of the visual area 15 and the gap G between the standard mark 51 and visual area 15 is also necessary. The gap G between the standard mark 51 and visual area 15 must be at least tolerance or more.

Figure 7:
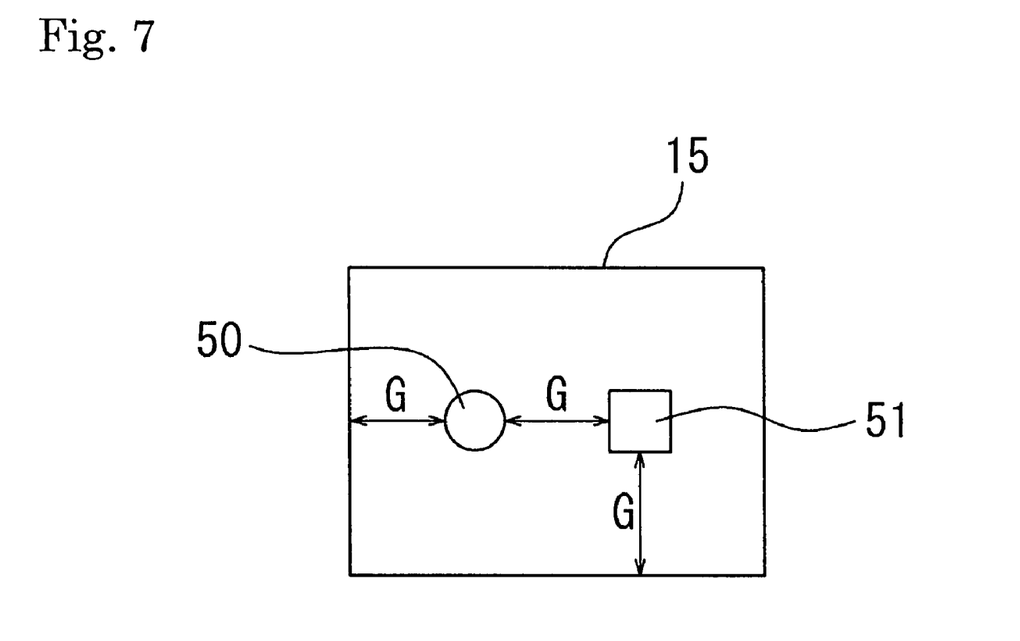
FIG. 7 is a plane view of the projected shapes of another embodiment of the standard marks 50 and 51.

Other embodiment of the standard mark 50 and standard mark 51 is shown in FIG. 7 where the standard mark 50 shapes round and the standard mark 51 is formed in just square shape. The standard marks 50 and 51 are preferably different at least in the shape or the size so as to easily distinguish the marks. There are also set the gaps G between the standard mark 50 and the standard mark 51, between the standard mark 50 and the visual area 15 and between the standard mark 51 and the visual area 15.

Figure 8:
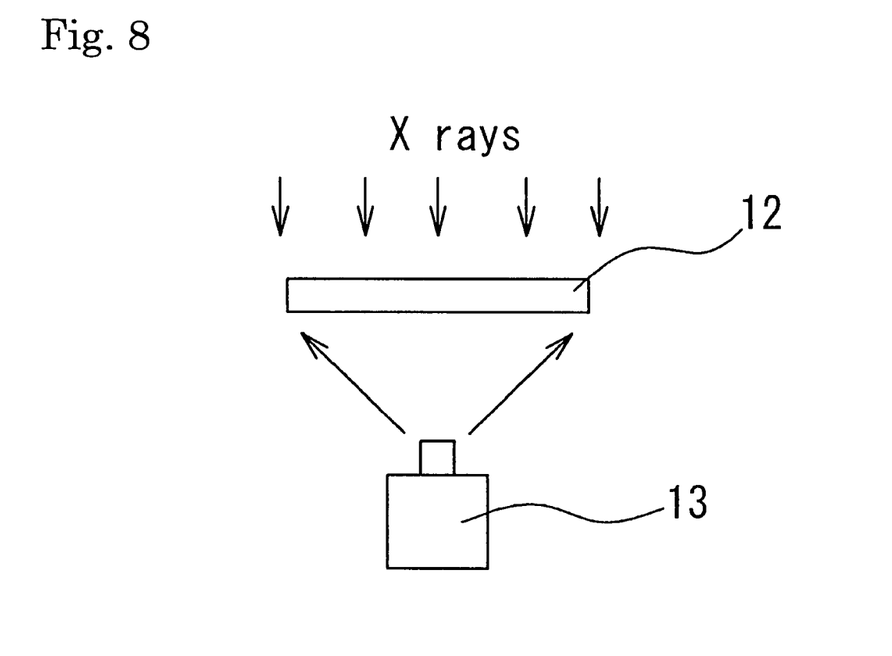
FIG. 8 is a schematic view explaining the visual area 15.
Figure 9:
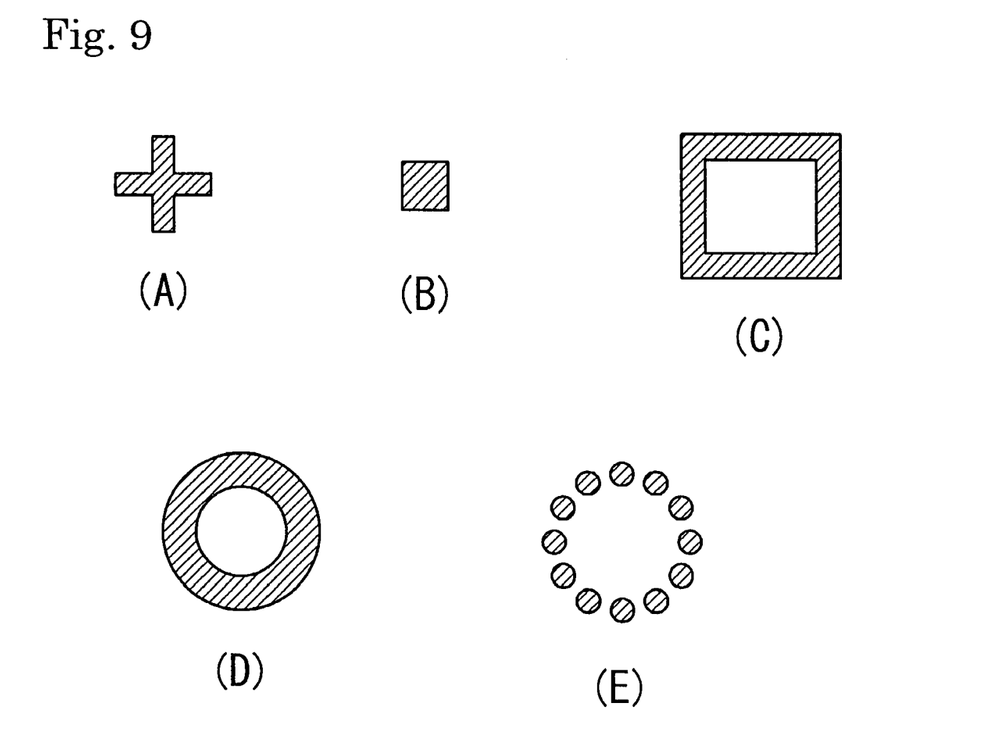
FIG. 9 is a plane view of other shapes of the standard mark 50 and the standard mark 51.

The visual area 15 will be explained in detail referring to FIG. 8. The visual area 15 of the standard mark detection device 1 is defined by the optical column and it is limited by the narrowest sight among the area of X-rays radiation, the size of the fluorescence screen 12 and the sight of the visible light CCD camera 13.

The X-rays radiation area is usually limited as the same as the size of the fluorescence screen 12 in view of safety and the size of the fluorescence screen 12 is usually larger than the sight of the visible light CCD camera 13. Thus typically the visual area 15 comes to be the same as the visual sight area of the visible light CCD camera 13.

The shapes of the standard marks 50 and 51 are variable and FIGS. 9(A)-(E) show other examples of the shapes in plane views which can be employed.

In said embodiments, the positions of the standard mark 50 and the standard mark 51 are shifted in a plane direction so that the visible light CCD camera 13 can take different images for the standard mark 50 and the standard mark 51 respectively.

However even when the marks 50 and 51 are overlapped, it may possible to distinguish the marks 50 and 51 by shading of the images depending on some conditions.

Figure 10:
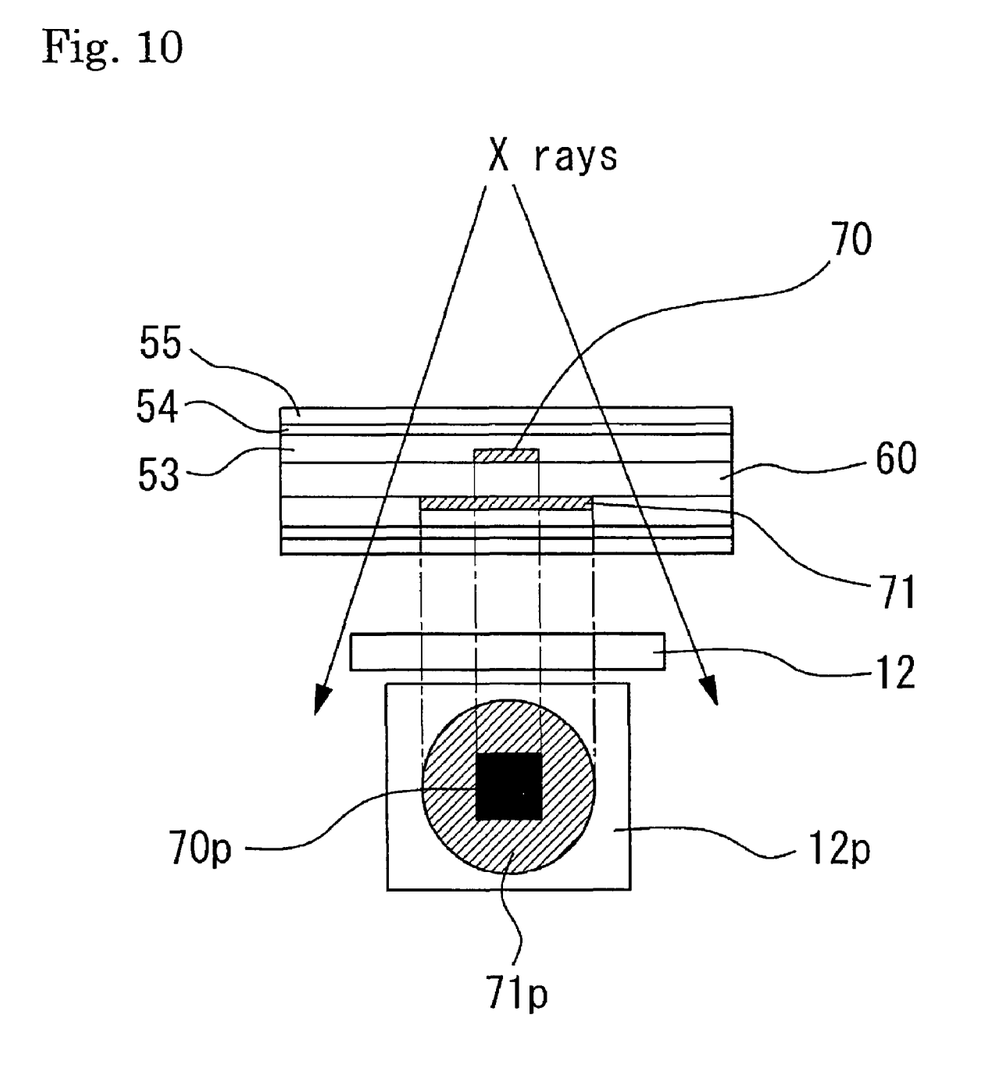
FIG. 10 is a schematic view of the other embodiment of the invention.

In the embodiment of FIG. 10, a standard mark 70 is in square shape and a standard mark 71 is in a round shape larger than the standard mark 70. A plane view of the fluorescence screen 12 is shown below the fluorescence screen 12 in FIG. 10. The fluorescence screen 12p has the projected images of the standard mark 70p and the standard mark 71p overlapping each other. There are light and shade between the image of the standard mark 70p and the standard mark 71p caused by the difference of penetrated values of X-rays between the standard marks 70 and 71 and the light and shade allow to distinguish the two marks and to detect the positions of the marks.

The ability of distinguishing the standard mark 70 and the standard mark 71 depends on the power of the X-rays, the thickness of the resist, the thickness of the core board 60, the thickness of the mark, the characteristic of the fluorescence screen 12, and the characteristic of the visible light CCD camera 13. Thus the appropriate selection of such conditions is necessary for obtaining good performance in distinction of the marks.

In the construction described above, the board 5 is placed on the stage 3 and properly positioned so as to set the standard mark 50 and the standard mark 51 within the area of the X-rays to be transmitted from the X-ray generator 11 and within the fluorescence screen 12 (within the sight of the visible light CCD camera 13). Then, X-rays are irradiated at the board 5 from the X-ray generator 11, the image of the standard marks 50, 51 are projected on the fluorescence screen 12, the resulted image is photographed by the visible light CCD camera 13 and finally processed by the control device 9 to determine the position of the standard marks 50 and 51. As shown in FIG. 5, both the standard marks 50 and 51 can be simultaneously photographed by one shot.

The fluorescence screen 12 retracts to a pre-set position upon completion of the mark detection process.

Also, the visible light CCD camera 13 may be replaced with a regular 11 camera.

The marking device 2 comprises a ultra-violet lamp 20, optic fibers 21, mirrors 22, 23, photo masks 24, 25 having alignment marks respectively and said XY stages 29.

By positioning the mirrors 22 and 23 on the front and back sides of the board 5 respectively, the alignment marks depicted on the photo masks 24 and 25 can be imprinted on the dry film resist layers 55, respectively.

The sets of mirrors 22, 23 and the photo masks 24, 25 are movable respectively by XY stages 29, 29 in the XYZ directions, and are disposed under the control of the control device 9 at the positions respectively corresponding to the standard marks 50, 51 which are previously detected by the standard mark detection device 1.

In this embodiment, the alignment marks are imprinted at the same positions corresponding precisely to the detected standard marks 50 and 51 respectively, but they may also be imprinted respectively at another position in relation to the positions of the standard marks 50 and 51.

The ultra-violet rays, being generated by the ultra-violet lamp 20 and split by the optic fibers 21 and 21, are deflected by the mirrors 22 and 23 to the board 5, and simultaneously impinge upon the upper and lower dry film resist layers 55, 55. In this state, the alignment marks created on the photo masks 24 and 25 by the ultra-violet rays are imprinted on the dry film resist layers 55 and 55 respectively. The ultra-violet irradiation turns the dry film resists blue that become the new marks 40 and 41. The new blue marks 40 and 41 have enough contrast for the CCD to capture the mark when it is exposed by an exposure device in later process. The new mark will be used for alignment with an alignment mark of a photo mask used in circuit-patterning process.

Upon completion of the ultra-violet irradiation, the marking device 2 retracts to the originally set position.

The dry film resist layers 55 may be replaced with liquid resist layer.

Besides the method of pattern imprinting by ultra-violet rays as described above, marking by laser or ink-jet or even by stamping may also be possible.

In the embodiments described in FIG. 1, the standard mark detection device 1 and the marking device 2 are arranged horizontally in the upper-lower direction relative to the board 5. However it is also possible to vertically arrange all of the standard mark detection device 1, the marking device 2 and the board 5.

Also, instead of moving the standard mark detection device 1 and the marking device 2, the board 5 may be made movable, further both of them can be made movable.

As described above, the marking apparatus of the invention can detect the both of the standard mark 50 and standard mark 51 at one detection treatment and provide the fast detection of the marks.

Further the apparatus of the invention makes the new mark 40 on the front side of the board 5 based on the standard mark 50 and also makes the new mark 41 on the rear side based on the standard mark 51. Since such new marks are made independently, the apparatus can accomplish precise marking that reduces discrepancy of positions in a plane direction of the new marks between the inner side layers and outer side layers.

What is claimed is:

1. A marking apparatus used in a process for producing multi-layered printed circuit board having a core board and a plurality of vertically separated isolation layers and a plurality of vertically separated conductive layers at both front and rear sides of the core board, the apparatus comprising;
    at least one standard mark formed on a front side of the core board and at least one standard mark formed on a rear side of the core board, wherein said at least one standard mark on the front side of the core board is different from said at least one standard mark formed on the rear side of the core board in at least one of size and shape and each of the at least one standard marks is disposed in a certain area,
    a position detecting device that simultaneously detects the positions in a plane direction of the standard marks by simultaneously photographing the standard marks in the certain area using X-rays irradiating toward thickness direction of the multilayered printed circuit board,
    a marking device for making a first new mark on a surface of the multi-layered printed circuit board based on the detected position of said at least one standard mark disposed on the front side of the core board, and
    a marking device for making a second new mark on a surface of the multi-layered printed circuit board based on the detected position of said at least one standard mark disposed on the rear side of the core board.

2. The marking apparatus of claim 1 wherein,
    said at least two standard marks are disposed with a gap therebetween in a plane direction in a predetermined area.

3. The marking apparatus of claim 2 wherein,
    said gap is more than tolerance in a plane direction when making the layer on which the standard mark is formed.

4. The marking apparatus of claim 1 wherein,
    at least one of said two standard marks has a hole,
    other mark is disposed in said hole with a gap in a plane direction.

5. The marking apparatus of claim 4 wherein,
    said gap is more than tolerance in a plane direction when making the layer on which the standard mark is formed.

6. The marking apparatus of claim 4 wherein,
said position detecting device comprises;
a X-ray generator disposed at the one side of the multi-layered printed circuit board for irradiating X-rays in the thickness direction of the circuit board,
a fluorescence screen disposed at another side of the multi-layered printed circuit board for detecting said X-rays penetrating said circuit board, converting the X-rays into visible rays and projecting the visible images of the standard marks on the surface thereof,
a photographing device for photographing said images of the standard marks projected on the fluorescence screen.

7. The marking apparatus of claim 1 wherein,
at least part of said two standard marks are overlapped in a plane direction,
said position detecting device detects the positions by using the shade of the photographed images of the standard marks.

8. The marking apparatus of claim 1 wherein,
said position detecting device comprises;
a X-ray generator disposed at the one side of the multi-layered printed circuit board for irradiating X-rays in the thickness direction of the circuit board,
a fluorescence screen disposed at another side of the multi-layered printed circuit board for detecting said X-rays penetrating said circuit board, converting the X-rays into visible rays and projecting the visible images of the standard marks on the surface thereof,
a photographing device for photographing said images of the standard marks projected on the fluorescence screen.

9. A marking apparatus used in a process for producing multi-layered printed circuit board having a core board and a plurality of vertically separated isolation layers and a plurality of vertically separated conductive layers at both front and rear sides of the core board, the apparatus comprising;
at least one standard mark formed on a front side of the core board and at least one standard mark formed on a rear side of the core board, at least parts of each of said standard marks are overlapped in a plane direction;
a position detecting device that simultaneously detects the positions in a plane direction of said standard marks by simultaneously imaging the standard marks using X-rays irradiating toward a thickness direction of the multilayered printed circuit board and by using shaded portions of the images of the standard marks;
a marking device for making a new mark on a surface of the multi-layered printed circuit board based on the detected position of one of said standard marks; and
a marking device for making another new mark on a surface of the multi-layered printed circuit board based on the detected position of another of said standard marks.

10. A marking apparatus used in a process for producing a multi-layered printed circuit board having a core board that includes at least one standard mark formed on a front side of the core board and at least one standard mark formed on a rear side of the core board and a plurality of vertically separated isolation layers and a plurality of vertically separated conductive layers disposed on both front and rear sides of the core board, said at least one standard mark on the front side of the core board being different from said at least one standard mark formed on the rear side of the core board in at least one of size and shape, the apparatus comprising:
a position detecting device that detects positions in a plane direction of each of the at least one standard marks;
a marking device for making at least one new mark on a surface of a next layer of the multilayered printed circuit board based on the detected position of the at least one standard mark disposed on the front side of the core board, the detected position of the at least one standard mark disposed on the rear side of the core board, or the detected position of both of said standard marks relative to each other.

11. The apparatus as recited in claim 10, wherein the surface of the multilayered printed circuit board is a dry-film resist layer or a liquid resist layer.

12. The apparatus as recited in claim 11, wherein the surface of the multilayered printed circuit board is on the front side of core board or on the rear side of the core board or on both sides of the core board.

13. The apparatus as recited in claim 11, the marking device further including an ultraviolet light source, at least one mirror, and a corresponding photo mask for each mirror, said photo mask including at least one alignment mark that is selectively positionable to mask a portion of the dry-film or liquid resist layer.

14. The apparatus as recited in claim 13, the at least one new mark being located at said masked portion of the dry-film resist layer.

15. The apparatus as recited in claim 10, wherein the marking device includes a selectively positionable mirror for each side of the next layer of the multilayered printed circuit board to be marked with a new alignment mark.

16. The apparatus as recited in claim 10 further comprising a controller that is adapted to determine positions in a plane direction of each of the at least one standard marks, to control positioning of the marking device and of the at least one new mark with respect to the multilayered printed circuit board.

17. The apparatus as recited in claim 16, wherein the controller is adapted to control positioning of the marking device and of the at least one new mark by positioning at least one of said at least one mirrors, said corresponding photo masks, and the multi-layered printed circuit board.

* * * * *